(12) United States Patent
Okazaki et al.

(10) Patent No.: US 9,640,647 B2
(45) Date of Patent: May 2, 2017

(54) SEMICONDUCTOR DEVICE AND METHOD FOR MANUFACTURING THE SAME

(71) Applicant: Mitsubishi Electric Corporation, Tokyo (JP)

(72) Inventors: Hiroyuki Okazaki, Tokyo (JP); Kenichiro Kurahashi, Tokyo (JP); Hidetoshi Koyama, Tokyo (JP); Toshiaki Kitano, Tokyo (JP); Yoshitaka Kamo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/145,048

(22) Filed: May 3, 2016

(65) Prior Publication Data
US 2017/0077275 A1 Mar. 16, 2017

(30) Foreign Application Priority Data
Sep. 15, 2015 (JP) ................................. 2015-181634

(51) Int. Cl.
| | | |
|---|---|---|
| *H01L 29/08* | (2006.01) | |
| *H01L 29/778* | (2006.01) | |
| *H01L 29/66* | (2006.01) | |
| *H01L 29/47* | (2006.01) | |
| *H01L 29/40* | (2006.01) | |
| *H01L 21/04* | (2006.01) | |
| *H01L 21/285* | (2006.01) | |

(52) U.S. Cl.
CPC .......... *H01L 29/778* (2013.01); *H01L 29/402* (2013.01); *H01L 29/475* (2013.01); *H01L 29/66462* (2013.01); *H01L 21/0495* (2013.01); *H01L 21/28581* (2013.01); *H01L 29/0891* (2013.01)

(58) Field of Classification Search
CPC .......... H01L 21/0495; H01L 21/28581; H01L 29/0891
USPC .................................. 257/267; 438/178, 182
See application file for complete search history.

(56) References Cited

U.S. PATENT DOCUMENTS

| | | |
|---|---|---|
| 2006/0060895 A1 | 3/2006 | Hikita et al. |
| 2007/0158692 A1 | 7/2007 | Nakayama et al. |

(Continued)

FOREIGN PATENT DOCUMENTS

| | | |
|---|---|---|
| JP | 2006-086398 A | 3/2006 |
| JP | 2008-244002 A | 10/2008 |

(Continued)

OTHER PUBLICATIONS

Jinwook W. Chung et al. (2009) "Gate-Recessed InAlN/GaN HEMTs on SiC Substrate With Al2O3 Passivation" IEEE Electron Device Letters, vol. 30, No. 9. pp. 904-906.

*Primary Examiner* — George Fourson, III
(74) *Attorney, Agent, or Firm* — Studebaker & Brackett PC

(57) ABSTRACT

A semiconductor device includes: a substrate; a nitride semiconductor film on the substrate; a schottky electrode on the nitride semiconductor film; a first insulating film on the nitride semiconductor film, contacting at least part of a side surface of the schottky electrode, forming an interface with the nitride semiconductor film and formed of SiN; and a second insulating film covering the schottky electrode and the first insulating film and formed of AlO whose atomic layers are alternately disposed.

12 Claims, 10 Drawing Sheets

(56) References Cited

U.S. PATENT DOCUMENTS

| | | | |
|---|---|---|---|
| 2012/0091522 A1 | 4/2012 | Ozaki et al. | |
| 2012/0217507 A1 | 8/2012 | Ohki | |
| 2013/0277680 A1* | 10/2013 | Green | H01L 29/402 257/76 |
| 2014/0061659 A1* | 3/2014 | Teplik | H01L 29/402 257/76 |
| 2014/0092638 A1 | 4/2014 | Nishimori et al. | |
| 2014/0264360 A1* | 9/2014 | Huang | H01L 29/402 257/76 |
| 2015/0311329 A1* | 10/2015 | Nakazawa | H01L 29/66462 257/76 |

FOREIGN PATENT DOCUMENTS

| | | |
|---|---|---|
| JP | 2010-166084 A | 7/2010 |
| JP | 2011-238805 A | 11/2011 |
| JP | 2012-089677 A | 5/2012 |
| JP | 2012-175089 A | 9/2012 |
| JP | 2013-115323 A | 6/2013 |
| JP | 2014-072379 A | 4/2014 |
| WO | 2006/001369 A1 | 1/2006 |

* cited by examiner

SEMICONDUCTOR DEVICE AND METHOD FOR MANUFACTURING THE SAME

BACKGROUND OF THE INVENTION

Field

The present invention relates to a semiconductor device capable of improving the moisture resistance without increasing the thickness of the insulating film and a method for manufacturing the same.

Background

In a conventional device, a metal-insulator-semiconductor (MIS) is formed by inserting an insulating film between a gate electrode and a semiconductor in order to obtain improvements in withstand voltage and current collapse (see, for example, JP 2013-115323A). A device is also known in which a barrier layer formed of an oxide and a nitride is deposited between a gate metal constituted of Au and an SiN insulating film in order to obtain an improvement in reliability (see, for example, JP 2012-175089A).

In conventional GaN-HEMT transistors for radiofrequency devices, SiN (silicon nitride) is ordinarily used as a surface protective film to limit trapping between a semiconductor surface and the surface protective film for protecting the semiconductor surface. Also, an SiN moisture-resistant film is formed so as to cover a portion around the gate and the surface protective film. The moisture resistance cannot be improved unless the film thickness of the SiN moisture-resistant film is increased. With increase in film thickness, however, the capacitance increases, resulting in a degradation in RF characteristic.

SUMMARY

In view of the above-described problem, an object of the present invention is to provide a semiconductor device capable of improving the moisture resistance without increasing the thickness of the insulating film and a method for manufacturing the same.

According to the present invention, a semiconductor device includes: a substrate; a nitride semiconductor film on the substrate; a schottky electrode on the nitride semiconductor film; a first insulating film on the nitride semiconductor film, contacting at least part of a side surface of the schottky electrode, forming an interface with the nitride semiconductor film and formed of SiN; and a second insulating film covering the schottky electrode and the first insulating film and formed of AlO whose atomic layers are alternately disposed.

In the present invention, the schottky electrode and the first insulating film are covered with the second insulating film, which is formed of AlO whose atomic layers are alternately disposed. The moisture resistance can thereby be improved without increasing the thickness of the insulating film. AlO film whose atomic layers are alternately disposed has excellent isotropy and coverage. Therefore, properties including the water resistance can be improved without increasing the thickness of the insulating film.

Other and further objects, features and advantages of the invention will appear more fully from the following description.

DESCRIPTION OF EMBODIMENTS

A semiconductor device and a method for manufacturing the same according to the embodiments of the present invention will be described with reference to the drawings. The same components will be denoted by the same symbols, and the repeated description thereof may be omitted.

First Embodiment

Figure 1:
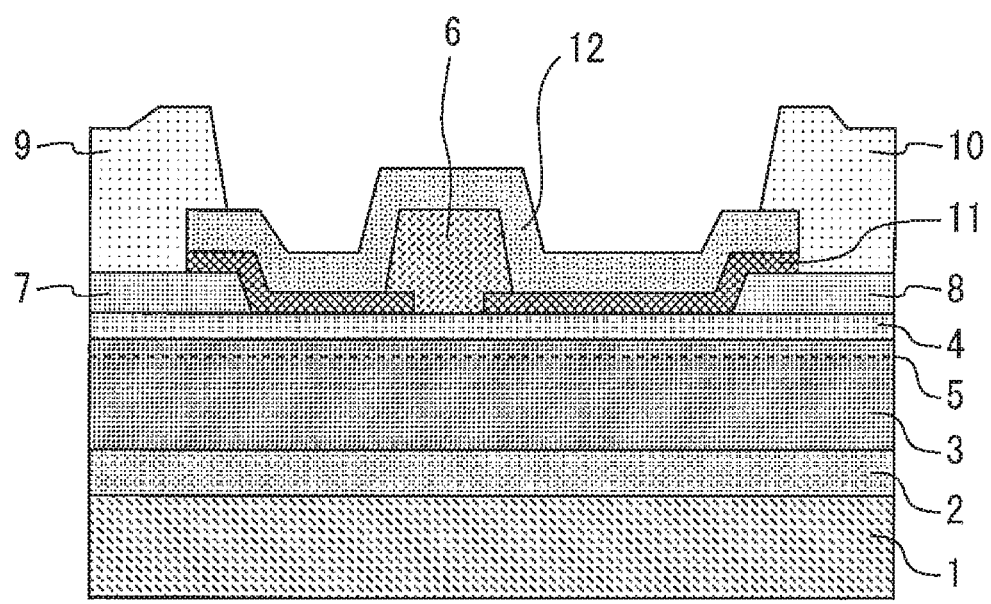
FIG. 1 is a sectional view of a semiconductor device according to a first embodiment of the present invention.

FIG. 1 is a sectional view of a semiconductor device according to a first embodiment of the present invention. This semiconductor device is a gallium nitride high-electron-mobility transistor (GaN HEMT) (field-effect transistor) having a schottky electrode.

A substrate 1 is constituted of Si, SiC or GaN, and it is desirable to set the specific resistance value of the substrate 1 to $1 \times 10^7$ Ωcm or higher in order to obtain a good radiofrequency characteristic. An $Al_{1-x}Ga_xN$ buffer layer 2 ($x \leq 1$), a GaN channel layer 3 and an $Al_{1-x}Ga_xN$ barrier layer 4 are successively formed on the substrate 1. Part or the whole of the GaN channel layer 3 may be doped with an impurity such as C or Fe. The $Al_{1-x}Ga_xN$ barrier layer 4 is formed of a single composition or a multilayer structure having a plurality of compositions. A 2DEG layer 5 specific to the GaN-HEMT is generated in the GaN channel layer 3.

A gate electrode 6, which is a schottky electrode, and a source electrode 7 and a drain electrode 8, which are ohmic electrodes, are formed on the $Al_{1-x}Ga_xN$ barrier layer 4. The gate electrode 6 is schottky-junctioned to the $Al_{1-x}Ga_xN$ barrier layer 4. The source electrode 7 and the drain electrode 8 are ohmic-junctioned to the $Al_{1-x}Ga_xN$ barrier layer 4. The gate electrode 6 is an electrode containing two or more of Pt, Ti, Ni, Ta, Au and Al. Each of the source electrode 7 and the drain electrode 8 is one of Pt, Ni and Ta. A source wiring element 9 and a drain wiring element 10 are formed on the source electrode 7 and the drain electrode 8, respectively.

A first insulating film 11 formed of SiN (silicon nitride) is formed on the $Al_{1-x}Ga_xN$ barrier layer 4. The first insulating film 11 contacts at least part of side surfaces of the gate electrode 6 and forms an interface with the $Al_{1-x}Ga_xN$ barrier layer 4. The first insulating film 11 is formed by using CVD or sputtering. A second insulating film 12 formed of AlO (aluminum oxide) is formed by atomic layer deposition (ALD) on an upper surface and the side surfaces of the gate electrode 6 and on at least a portion of the first insulating film 11 in contact with the semiconductor, and covers the gate electrode 6 and the first insulating film 11. ALD is a process in which raw material gases are alternately supplied into a reaction chamber and atomic layers are grown one after another by using a self stopping mechanism.

A method for manufacturing the above-described semiconductor device will subsequently be described. FIGS. 2 to 5 are sectional views showing a method for manufacturing the semiconductor device according to the first embodiment of the present invention.

Figure 2:
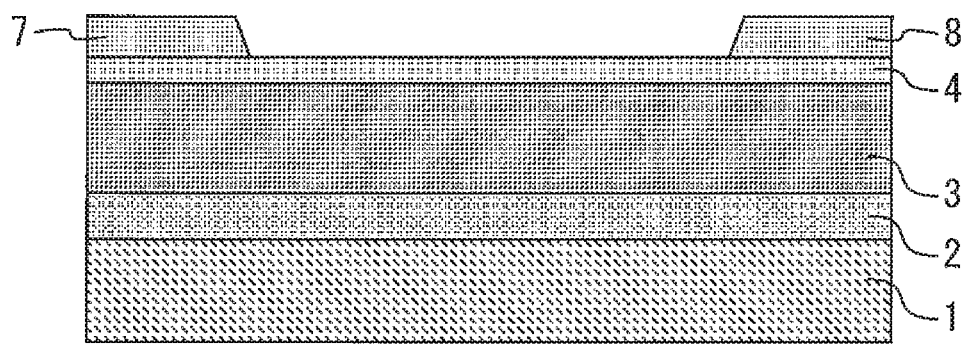
FIGS. 2 to 5 are sectional views showing a method for manufacturing the semiconductor device according to the first embodiment of the present invention.

First, as shown in FIG. 2, the $Al_{1-x}Ga_xN$ buffer layer 2 ($x\le1$), the GaN channel layer 3 and the $Al_{1-x}Ga_xN$ barrier layer 4 are successively formed on the substrate 1. The source electrode 7 and the drain electrode 8 are formed on the $Al_{1-x}Ga_xN$ barrier layer 4. A high-concentration impurity layer may be selectively formed under the electrodes, for example, by Si ion implantation and thermal annealing for the purpose of reducing the ohmic contact resistance.

Figure 3:
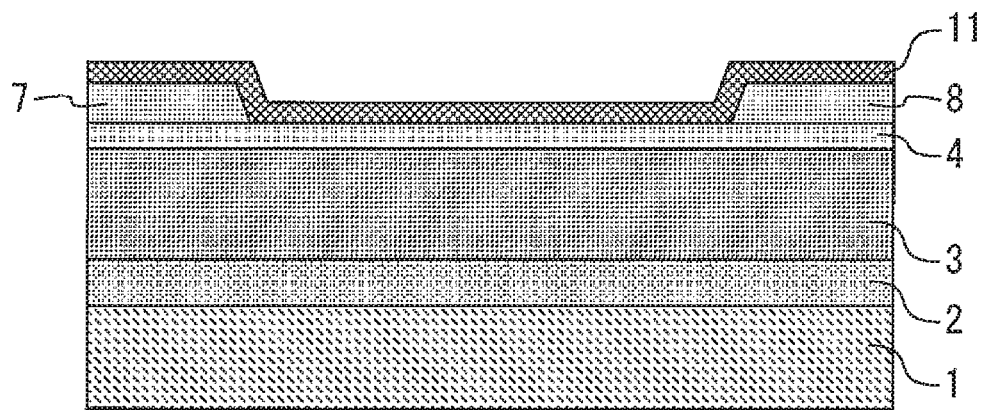
Figure 4:
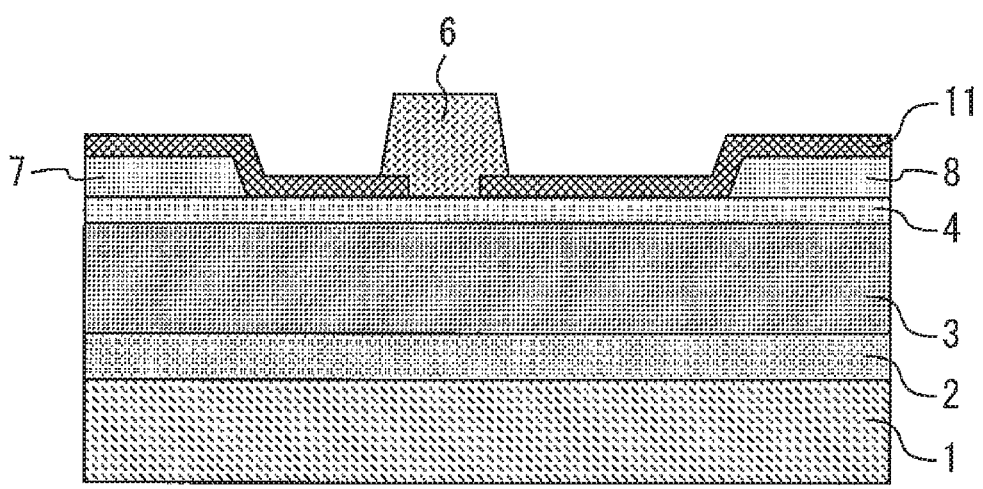

Subsequently, as shown in FIG. 3, the first insulating film 11 is formed by CVD or sputtering so as to cover all the $Al_{1-x}Ga_xN$ buffer layer 2, the source electrode 7 and the drain electrode 8. Subsequently, as shown in FIG. 4, an opening corresponding to the gate is formed in the first insulating film 11 by dry etching or wet etching, and the gate electrode 6 is formed, for example, by vapor deposition or sputtering. Any shape of the gate electrode 6 may be adopted regardless of the existence/nonexistence of a gate field plate (GFP) as long as the gate electrode 6 is thicker than the first insulating film 11.

Figure 5:
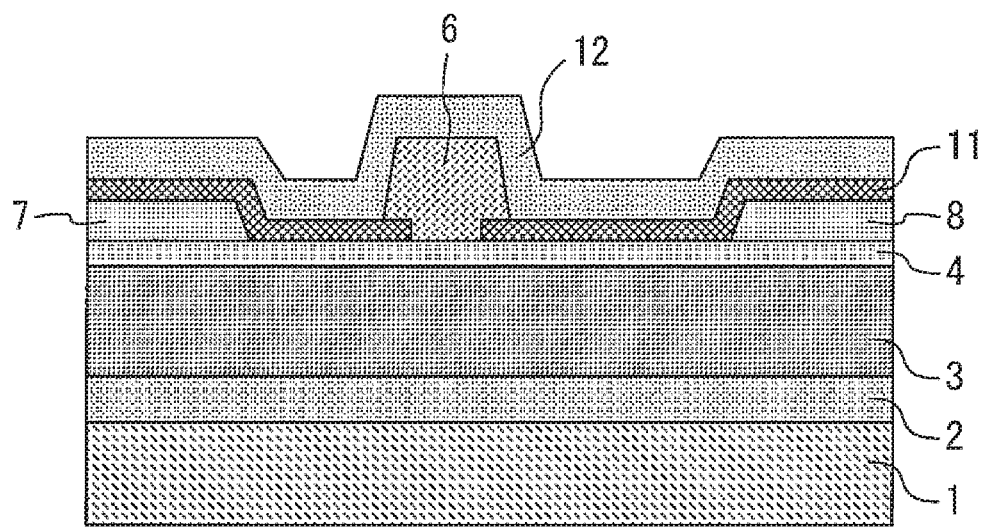

Subsequently, as shown in FIG. 5, the second insulating film 12 is formed by ALD so as to cover the gate electrode 6 and the first insulating film 11. Finally, openings are formed in the first insulating film 11 and the second insulating film 12 on the source electrode 7 and the drain electrode 8 by dry etching or wet etching, and the source wiring element 9 and the drain wiring element 10 are formed by vapor deposition or sputtering. The semiconductor device according to the present embodiment is manufactured by the above-described process.

In the present embodiment, as described above, the gate electrode 6 and the first insulating film 11 are covered with the second insulating film 12, which is formed of AlO whose atomic layers are alternately disposed. The moisture resistance can thereby be improved without increasing the thickness of the insulating film. Also, forming of the second insulating film 12 by ALD can be performed so that quality of film forming on a portion around the gate electrode 6 and a portion of the semiconductor surface not covered with any structural member such as a metal is uniform. Also, AlO film can be performed with excellent isotropy and coverage specific to atomic layer deposition. Therefore, even if the film thickness is reduced in comparison with the conventional art, properties including the water resistance can be improved as a result of the alternate disposition of atomic layers.

Figure 6:
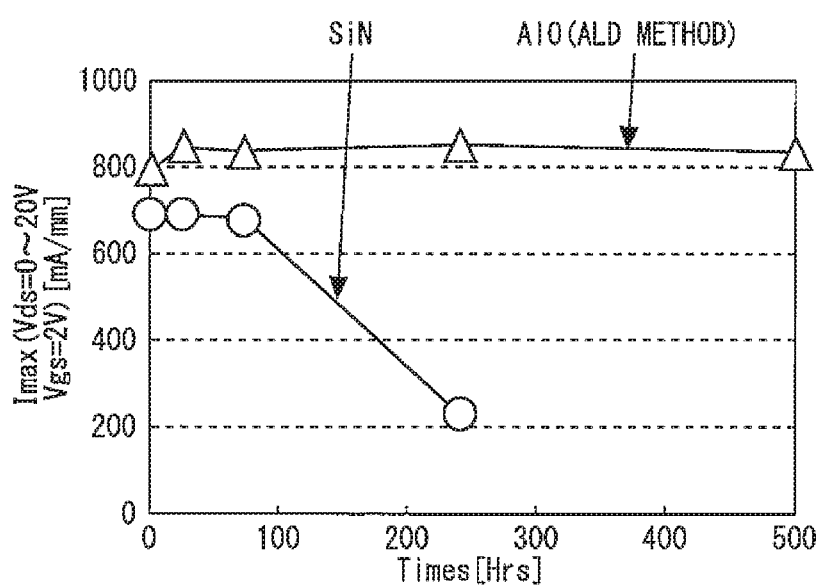
FIG. 6 is a diagram showing the results of a bias test according to the material of the second insulating film.

FIG. 6 is a diagram showing the results of a bias test according to the material of the second insulating film. Ra is 130° C.; RH is 85%; the gate voltage Vg is −5 V; and the drain voltage Vd is 30 V. The second insulating film 12 formed of AlO by ALD in the present embodiment can have improved moisture resistance during transistor operation in comparison with the conventional structure in which the second insulating film 12 is SiN.

Figure 7:
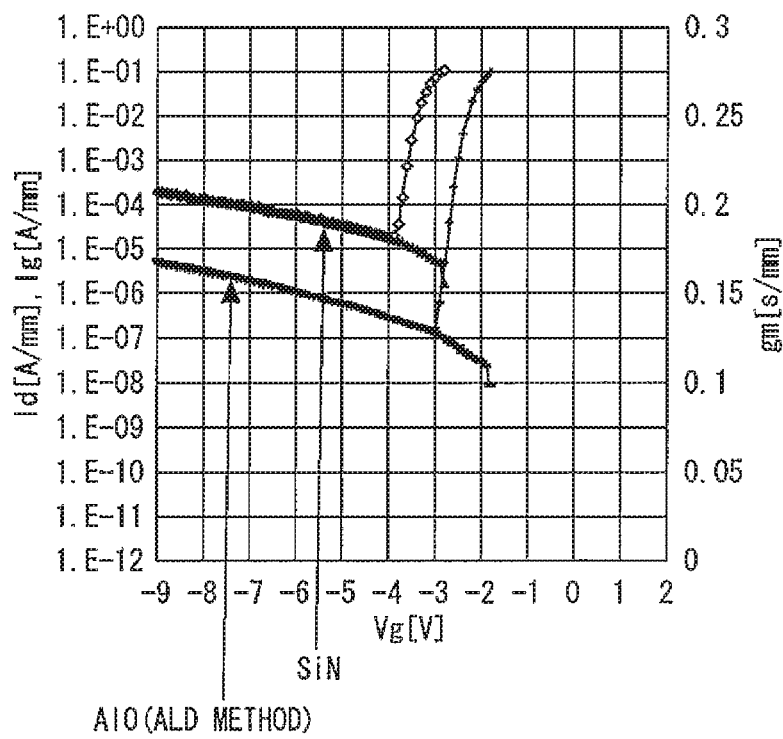
FIG. 7 is a diagram showing Ig-Vg and Id-Vg characteristics according to the material of the second insulating film.

FIG. 7 is a diagram showing Ig-Vg and Id-Vg characteristics according to the material of the second insulating film. This data is pinch-off curves when the drain voltage Vd is 5 V. The present embodiment is improved in Ig-Vg and Id-Vg characteristics in comparison with the conventional structure.

Figure 8:
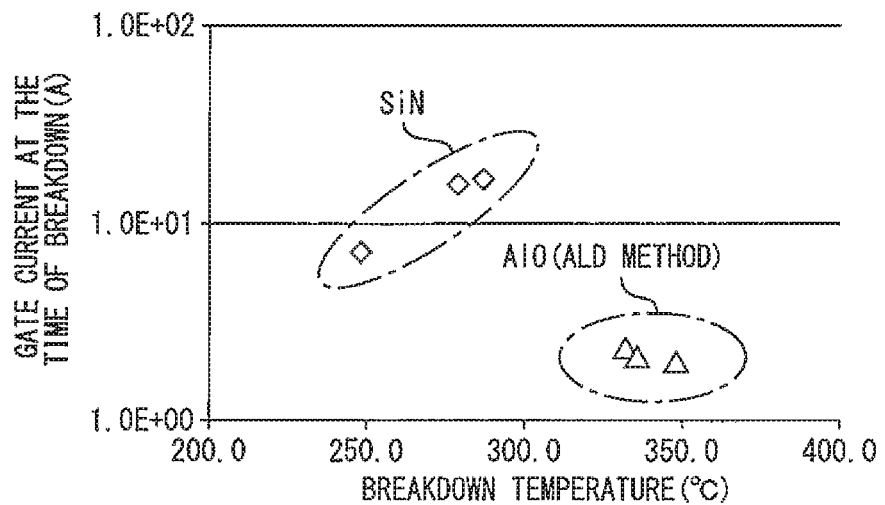
FIG. 8 is a diagram showing breakdown temperatures during high-temperature Vg sweep according to the material of the second insulating film.

FIG. 8 is a diagram showing breakdown temperatures during high-temperature Vg sweep according to the material of the second insulating film. The drain voltage Vd is 55 V. The breakdown temperature in the present embodiment is higher than that in the conventional structure, and the gate current at the time of breakdown in the present embodiment is smaller.

Figure 9:
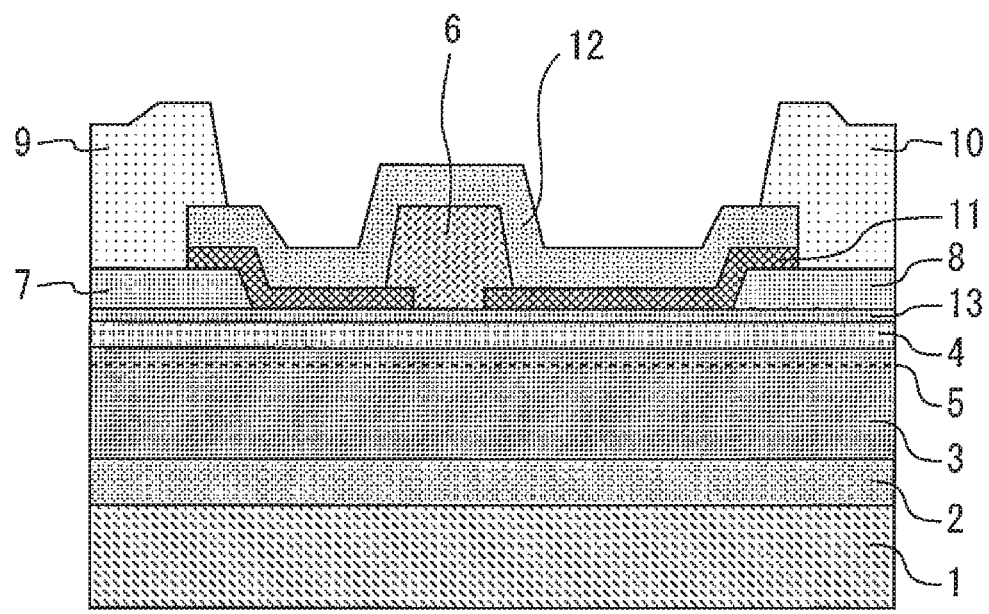
FIG. 9 is a sectional view showing a modified example of the semiconductor device according to the first embodiment of the present invention.

FIG. 9 is a sectional view showing a modified example of the semiconductor device according to the first embodiment of the present invention. A GaN cap layer 13 (having a film thickness of 10 nm or less) is inserted on the $Al_{1-x}Ga_xN$ barrier layer 4. The advantages of the first embodiment can also be obtained in this case.

Second Embodiment

Figure 10:
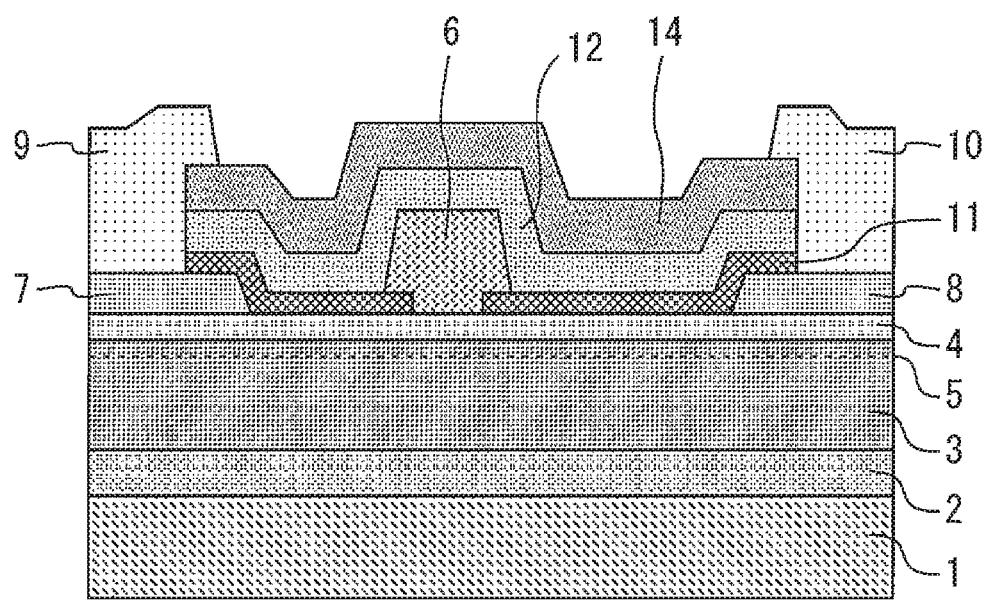
FIG. 10 is a sectional view of a semiconductor device according to a second embodiment of the present invention.

FIG. 10 is a sectional view of a semiconductor device according to a second embodiment of the present invention. The second embodiment includes a third insulating film 14 added to the structure according to the first embodiment, the third insulating film 14 covering the second insulating film 12. The third insulating film 14 is an oxide or a nitride of an element selected from Si, Al, Ti, Ta, W, Mo and Zr.

The coverage is improved by layering the third insulating film 14. As a result, the moisture resistance is further improved. Also, the film stress can be relieved and film separation abnormality during high-temperature operation, for example, can therefore be inhibited.

Third Embodiment

Figure 11:
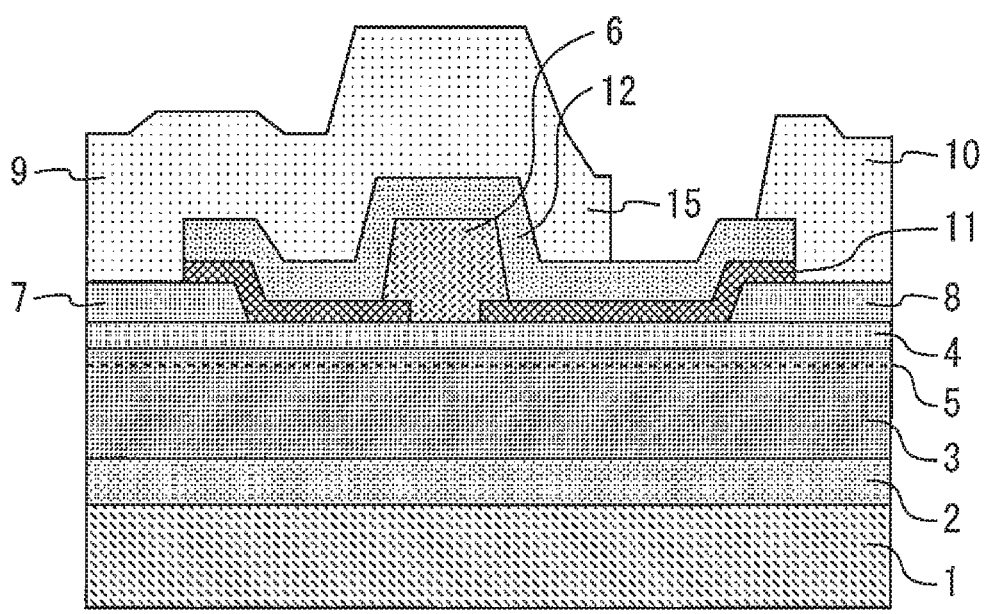
FIG. 11 is a sectional view of a semiconductor device according to a third embodiment of the present invention.

FIG. 11 is a sectional view of a semiconductor device according to a third embodiment of the present invention. The third embodiment includes a source field plate 15 added to the structure according to the first embodiment. The source field plate 15 is disposed between the gate electrode 6 and the drain electrode 8 and electrically connected to the source electrode 7.

The electric field relief effect around the gate electrode 6 can be improved by means of the source field plate 15. Further, with the improvement in electric field relief effect, the gate leak current is reduced and the high-temperature operability is improved. Also, the gate-drain capacitance can be reduced by shutting off lines of electric force from the gate electrode 6 to the drain electrode 8 with the source field plate 15. An improvement in gain can thereby be achieved.

Figure 12:
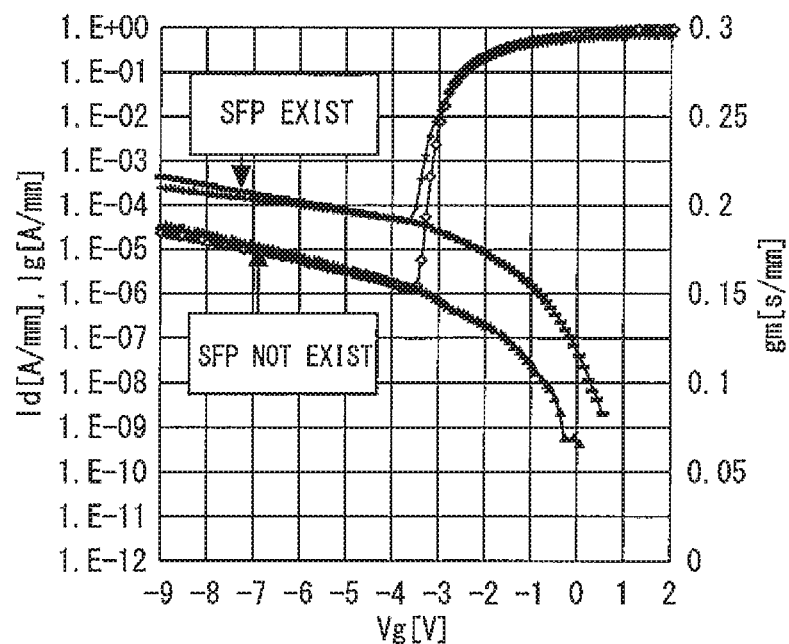
FIG. 12 is a diagram showing Ig-Vg and Id-Vg characteristics according to the existence/nonexistence of the source field plate (SFP).

FIG. 12 is a diagram showing Ig-Vg and Id-Vg characteristics according to the existence/nonexistence of the source field plate (SFP). This data is pinch-off curves when the drain voltage Vd is 5 V. The Ig-Vg and Id-Vg characteristics are improved as a result of the provision of the source field plate.

Figure 13:
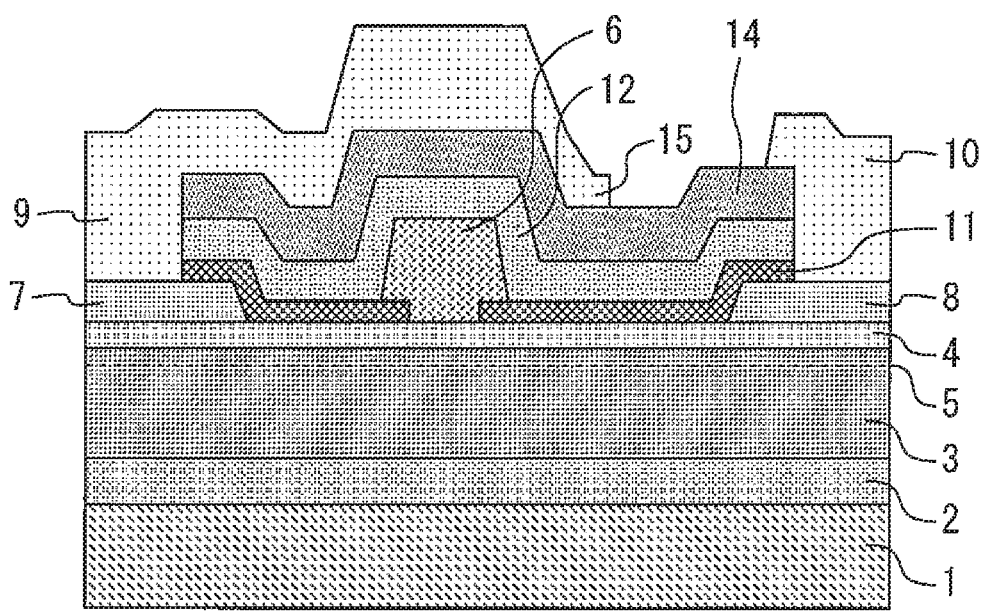
FIG. 13 is a sectional view showing a modified example of the semiconductor device according to the third embodiment of the present invention.

FIG. 13 is a sectional view showing a modified example of the semiconductor device according to the third embodiment of the present invention. This modified example includes the source field plate 15 added to the structure according to the second embodiment. The above-described advantages can also be obtained in this case.

Figure 14:
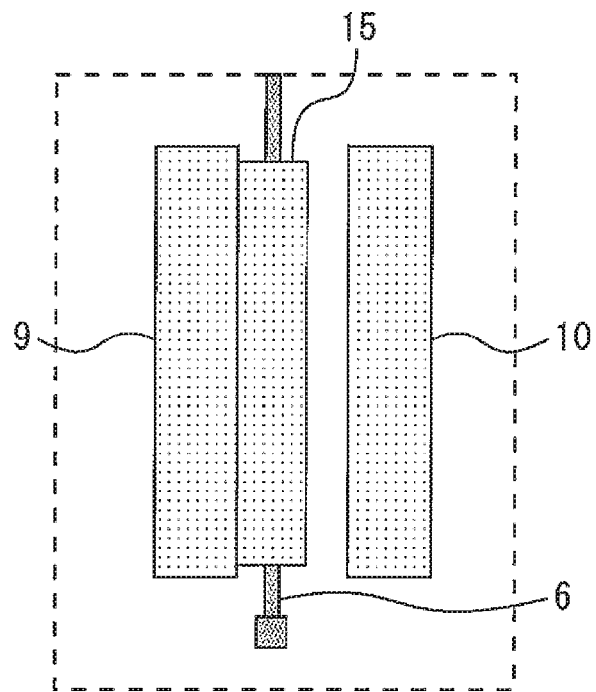
FIGS. 14 to 16 are top views of the semiconductor device according to the third embodiment of the present invention.
Figure 15:
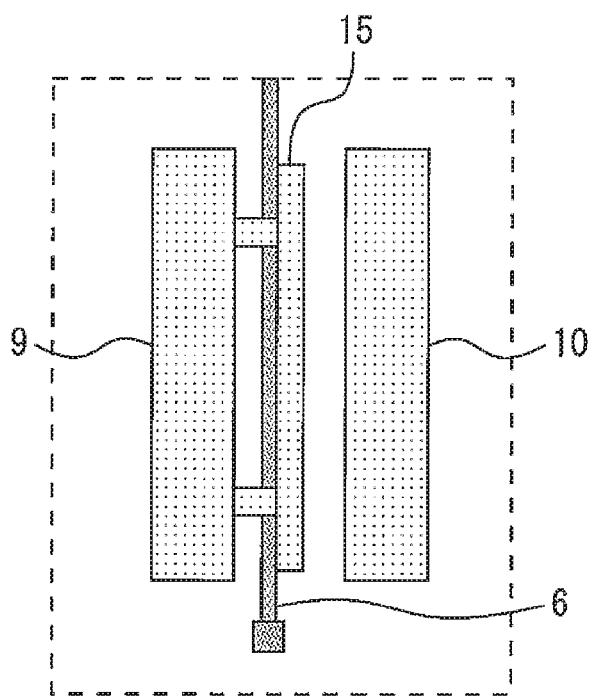
Figure 16:
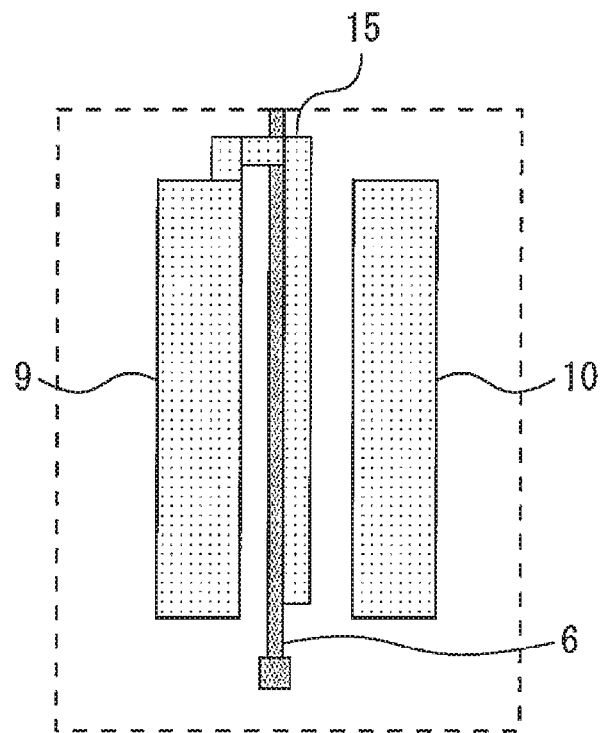

FIGS. 14 to 16 are top views of the semiconductor device according to the third embodiment of the present invention. Referring to FIG. 14, generally the entire surface of the source wiring element 9 and the source field plate 15 are joined to each other. Referring to FIG. 15, part of the source wiring element 9 and the source field plate 15 are joined to each other. At least one portion of the source wiring element 9 may be joined in such a way. The source wiring element 9 may also be extended outward in a roundabout fashion to be joined to the source field plate 15, as shown in FIG. 16. These patterns have substantially the same effect. Any one of the entire surface joining, partial joining and roundabout joining may therefore be used as joining between the source field plate 15 and the source electrode 7.

Fourth Embodiment

Figure 17:
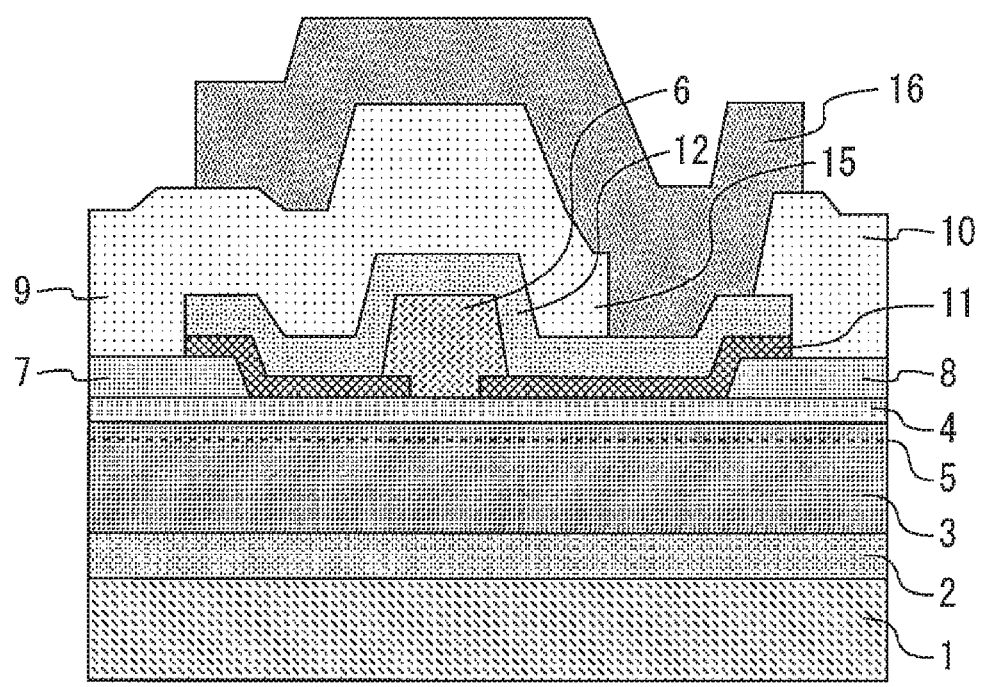
FIG. 17 is a sectional view of a semiconductor device according to a fourth embodiment of the present invention.

FIG. 17 is a sectional view of a semiconductor device according to a fourth embodiment of the present invention. A fourth insulating film 16 is formed as a moisture-resistant film covering the source field plate 15. The fourth insulating film 16 is an oxide or a nitride of an element selected from Si, Al, Ti, Ta, W, Mo and Zr. In other respects, the construction is the same as that of the third embodiment shown in FIG. 11. A reduction in moisture resistance due to the provision of the source field plate 15 in the construction shown in FIG. 11 can thereby be prevented.

Figure 18:
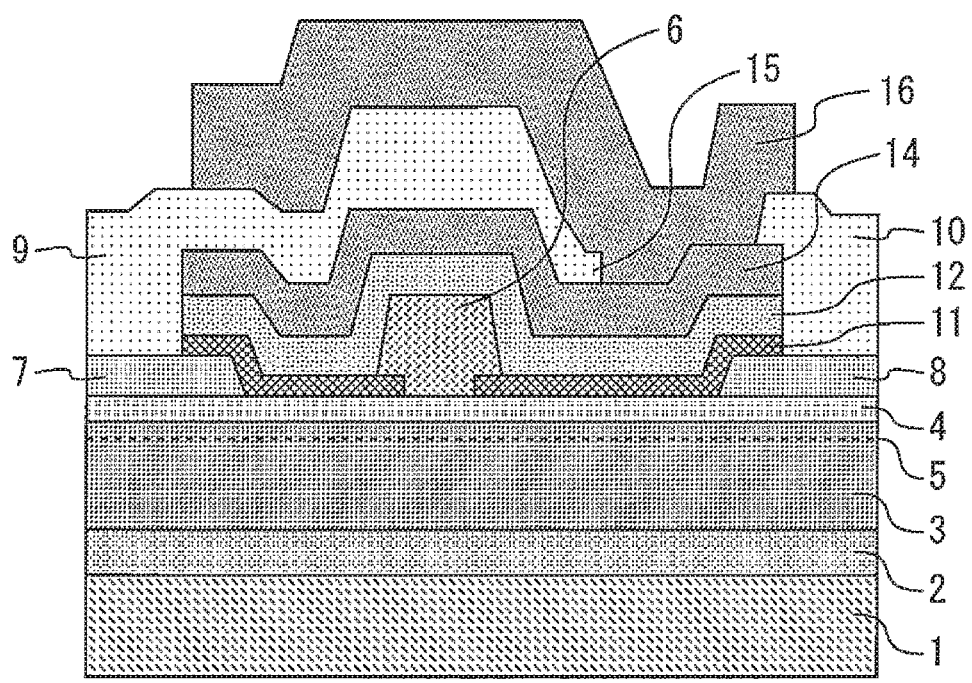
FIG. 18 is a sectional view showing a modified example of the semiconductor device according to the fourth embodiment of the present invention.

FIG. 18 is a sectional view showing a modified example of the semiconductor device according to the fourth embodiment of the present invention. This modified example includes the fourth insulating film 16 added to the structure according to the third embodiment shown in FIG. 13, the fourth insulating film 16 covering the source field plate 15. A reduction in moisture resistance due to the provision of the source field plate 15 in the construction shown in FIG. 13 can thereby be prevented.

Fifth Embodiment

Figure 19:
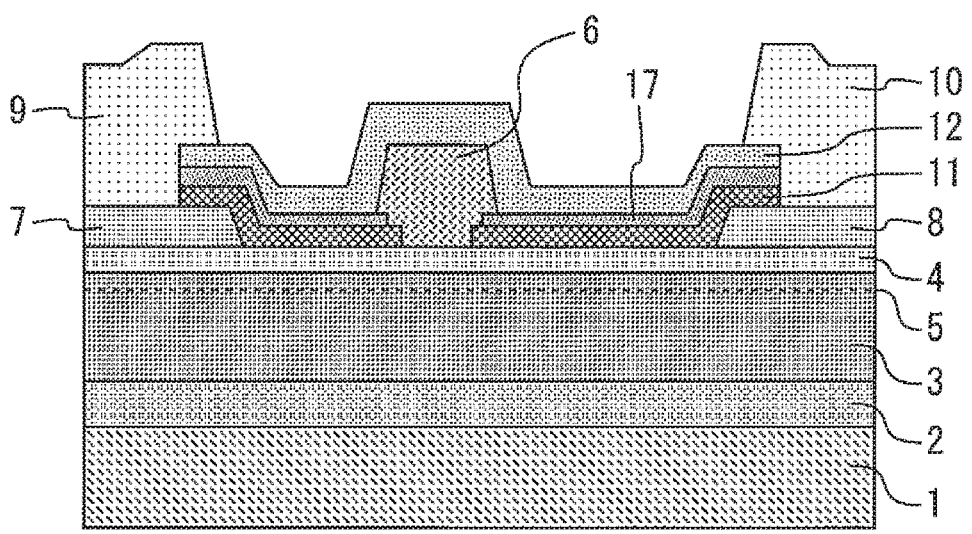
FIG. 19 is a sectional view of a semiconductor device according to a fifth embodiment of the present invention.

FIG. 19 is a sectional view of a semiconductor device according to a fifth embodiment of the present invention. In the fifth embodiment, a fifth insulating film 17 is inserted between the first insulating film 11 and the second insulating film 12. Portions of the gate electrode 6s are disposed on the first and fifth insulating films 11 and 17 to form a two-stage gate field plate structure. The fifth insulating film 17 is an oxide or a nitride of an element selected from Si, Al, Ti, Ta, W, Mo and Zr. In other respects, the construction is the same as that in the first embodiment.

The insertion of the fifth insulating film 17 facilitates making of a gate field plate (GFP) in two stages. Because of use of the two-stage GFP structure, the electric field relief effect is improved. Further, with the improvement in electric field relief effect, the gate leak current is reduced and the high-temperature operability is improved.

Either of one-stage and two-stage structures of the GFP at the gate electrode 6 may suffice as long as the second insulating film 12 covers the gate electrode 6. A trapezoidal shape or the like with no GFP may alternatively suffice. The construction according to the present embodiment may be applied to any of the second, third and fourth embodiments.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-181634, filed on Sep. 15, 2015 including specification, claims, drawings and summary, on which the Convention priority of the present application is based, is incorporated herein by reference in its entirety.

The invention claimed is:

1. A semiconductor device comprising:
   a substrate;
   a nitride semiconductor film on the substrate;
   a schottky electrode on the nitride semiconductor film;
   a first insulating film on the nitride semiconductor film, contacting at least part of a side surface of the schottky electrode, forming an interface with the nitride semiconductor film and formed of SiN; and
   a second insulating film covering the schottky electrode and the first insulating film and formed of AlO whose atomic layers are alternately disposed, and
   further comprising a fifth insulating film inserted between the first insulating film and the second insulating film, wherein a portion of the schottky electrode is disposed on the first and fifth insulating films to form a two-stage gate field plate structure.

2. The semiconductor device of claim 1, further comprising a source electrode and a drain electrode which are ohmic functioned to the nitride semiconductor film,
   wherein the schottky electrode is a gate electrode schottky functioned to the nitride semiconductor film, and the semiconductor device is a field-effect transistor.

3. The semiconductor device of claim 1, further comprising a third insulating film covering the second insulating film.

4. The semiconductor device of claim 3, wherein the third insulating film is an oxide or a nitride of an element selected from Si, Al, Ti, Ta, W, Mo and Zr.

5. The semiconductor device of claim 2, further comprising a source field plate disposed between the gate electrode and the drain electrode and electrically connected to the source electrode.

6. A semiconductor device comprising:
   a substrate;
   a nitride semiconductor film on the substrate;
   a schottky electrode on the nitride semiconductor film;
   a first insulating film on the nitride semiconductor film, contacting at least part of a side surface of the schottky electrode, forming an interface with the nitride semiconductor film and formed of SiN; and
   a second insulating film covering the schottky electrode and the first insulating film and formed of AlO whose atomic layers are alternately disposed,
   further comprising a source electrode and a drain electrode which are ohmic functioned to the nitride semiconductor film, wherein
   the schottky electrode is a gate electrode schottky-junctioned to the nitride semiconductor film,
   the semiconductor device is a field-effect transistor, and
   a source field plate disposed between the gate electrode and the drain electrode and electrically connected to the source electrode, wherein any one of an entire surface joining, a partial joining and a roundabout joining is used as joining between the source field plate and the source electrode.

7. The semiconductor device of claim 5, further comprising a fourth insulating film covering the source field plate.

8. The semiconductor device of claim 7, wherein the fourth insulating film is an oxide or a nitride of an element selected from Si, Al, Ti, Ta, W, Mo and Zr.

9. The semiconductor device of claim 1, wherein the fifth insulating film is an oxide or a nitride of an element selected from Si, Al, Ti, Ta, W, Mo and Zr.

10. The semiconductor device of claim 1, wherein the schottky electrode is an electrode containing two or more of Pt, Ti, Ni, Ta, Au and Al.

11. The semiconductor device of claim 1, wherein the substrate is constituted of Si, SiC or GaN.

12. A method for manufacturing a semiconductor device comprising:

forming a nitride semiconductor film on a substrate;

forming a schottky electrode on the nitride semiconductor film;

forming a first insulating film on the nitride semiconductor film, wherein the first insulating film contacts at least part of a side surface of the schottky electrode, forms an interface with the nitride semiconductor film and is formed of SiN;

forming a fifth insulating film on the first insulating film; and forming a second insulating film covering the schottky electrode and the first insulating film and formed of AlO by atomic layer deposition;

wherein a portion of the schottky electrode is disposed on the first and fifth insulating films to form a two-stage gate field plate structure.

* * * * *